(12) United States Patent
Kim et al.

(10) Patent No.: US 9,380,242 B2
(45) Date of Patent: Jun. 28, 2016

(54) IMAGE SENSOR AND DEVICES HAVING THE SAME

(71) Applicant: Samsung Electronics Co., Ltd., Suwon-Si, Gyeonggi-Do (KR)

(72) Inventors: Seoung Hyun Kim, Hwaseong-si (KR); Mun Hwan Kim, Seoul (KR); Chan Hyung Kim, Seongnam-si (KR); Jung Bin Yun, Hwaseong-si (KR); Young Gu Jin, Osan-si (KR); Seung Won Cha, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/496,445

(22) Filed: Sep. 25, 2014

(65) Prior Publication Data

US 2015/0116565 A1    Apr. 30, 2015

(30) Foreign Application Priority Data

Oct. 25, 2013    (KR) .......................... 10-2013-0127545

(51) Int. Cl.
*H04N 5/378* (2011.01)
*H04N 5/3745* (2011.01)
*H04N 9/04* (2006.01)
*H01L 27/146* (2006.01)

(52) U.S. Cl.
CPC ........ *H04N 5/37457* (2013.01); *H01L 27/1461* (2013.01); *H01L 27/14607* (2013.01); *H01L 27/14612* (2013.01); *H01L 27/14641* (2013.01); *H01L 27/14645* (2013.01); *H04N 9/045* (2013.01)

(58) Field of Classification Search
CPC ... H04N 5/3559; H04N 5/3698; H04N 5/378; H04N 5/37452
USPC ............................... 348/300–308; 250/208.1
See application file for complete search history.

(56) References Cited

U.S. PATENT DOCUMENTS

| | | | |
|---|---|---|---|
| 5,965,875 A | 10/1999 | Merrill | |
| 6,157,016 A * | 12/2000 | Clark | ................ H01L 27/14609 250/208.1 |
| 7,400,022 B2 | 7/2008 | Tishin et al. | |
| 7,611,918 B2 | 11/2009 | Joon | |

(Continued)

FOREIGN PATENT DOCUMENTS

| | | |
|---|---|---|
| JP | 2006310343 A | 11/2006 |
| JP | 2011243862 A | 12/2011 |

(Continued)

*Primary Examiner* — Tuan Ho
(74) *Attorney, Agent, or Firm* — Harness, Dickey & Pierce, P.L.C.

(57) ABSTRACT

An image sensor according to an example embodiment of includes a first pixel and a second pixel in a first row. The first pixel includes a first photoelectric conversion element at a first depth in a semiconductor substrate and the first photoelectric conversion element is configured to convert a first visible light spectrum into a first photo charge, and the second pixel includes a second photoelectric conversion element at a second depth from the first depth in the semiconductor substrate, the second photoelectric conversion element is at least partially overlapped by the first photoelectric conversion element in a vertical direction, and the second photoelectric conversion element is configured to convert a second visible light spectrum into a second photo charge.

19 Claims, 9 Drawing Sheets

(56) References Cited

U.S. PATENT DOCUMENTS

| | | | |
|---|---|---|---|
| 7,800,148 B2 | 9/2010 | Lee et al. | |
| 2002/0190254 A1* | 12/2002 | Turner | H01L 27/14647 257/59 |
| 2008/0185619 A1* | 8/2008 | Merrill | H01L 27/14647 257/292 |
| 2010/0102206 A1 | 4/2010 | Cazaux et al. | |

FOREIGN PATENT DOCUMENTS

| | | |
|---|---|---|
| KR | 0672678 B1 | 1/2007 |
| KR | 20070098223 A | 10/2007 |
| KR | 20100112906 A | 10/2010 |

* cited by examiner

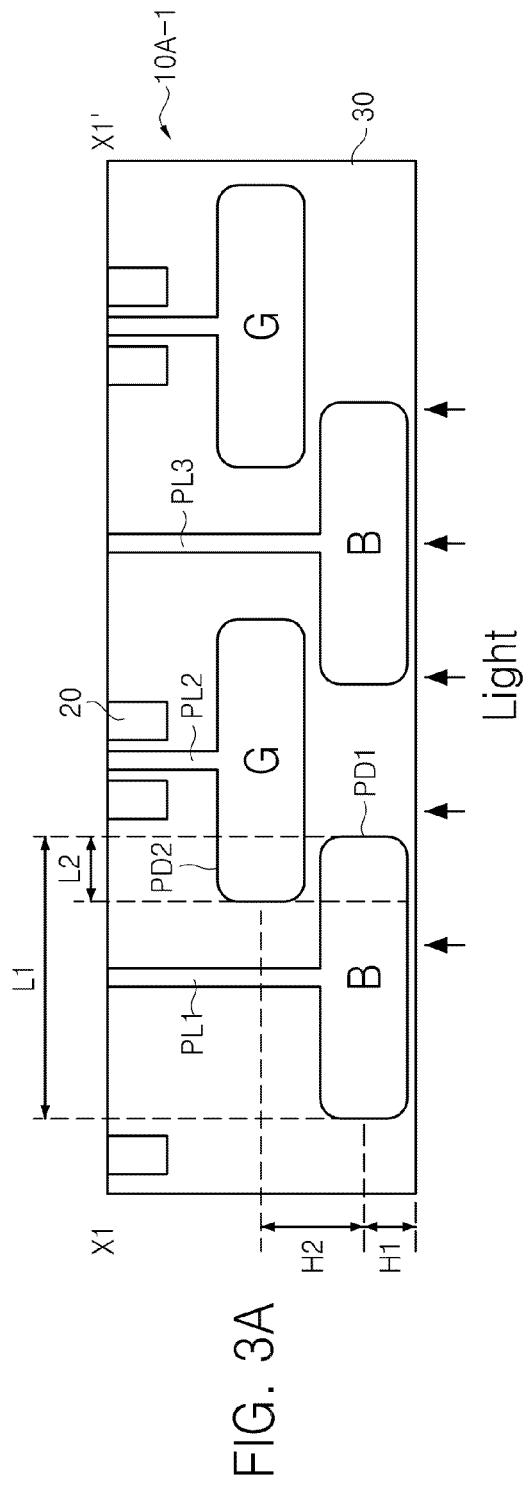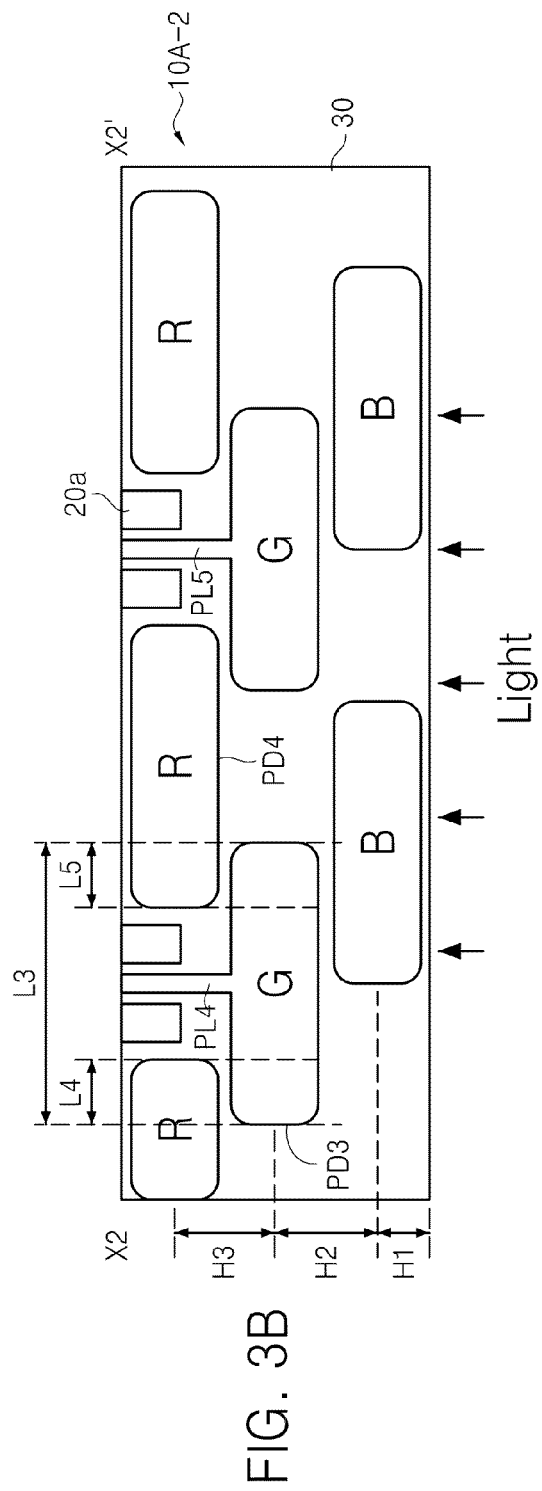
FIG. 3A
FIG. 3B

IMAGE SENSOR AND DEVICES HAVING THE SAME

CROSS-REFERENCE TO RELATED APPLICATIONS

This application claims priority under 35 U.S.C. §119(a) from Korean Patent Application No. 10-2013-0127545 filed on Oct. 25, 2013, the disclosure of which is hereby incorporated by reference in its entirety.

BACKGROUND

Example embodiments of inventive concepts relate to a complementary metal oxide semiconductor (CMOS) image sensor.

The CMOS image sensor is a solid-state image sensing device using a complementary metal oxide semiconductor (CMOS). The CMOS image sensor has a lower manufacturing cost than a charge coupled device (CCD) image sensor including a high-voltage analog circuit, and consumes less power due to the small size thereof.

Recently, as the CMOS image sensor has improved in performance, the CMOS image sensor has been used in various consumer electronics in addition to portable electronic devices such as smart phones and digital cameras. The CMOS image sensor includes a photo-electric conversion element configured to receive light and convert the light into an electrical signal. The more light received by the photo-electric conversion element, the better the photo sensitivity of the CMOS image sensor.

As the CMOS image sensor has recently become smaller, that the sensitivity of the CMOS image sensor lowers. For example, as a pixel of an image sensor becomes smaller, a photo-electric conversion element of the pixel decreases in size and the sensitivity of the CMOS image sensor is affected by the size of the pixel.

SUMMARY

An example embodiment of inventive concepts is directed to an image sensor, including a first pixel and a second pixel arranged in a first row. The first pixel includes a first photo-electric conversion element at a first depth in a semiconductor substrate and the first photoelectric conversion element is configured to convert a first visible light spectrum into a first photo charge, and the second pixel includes a second photo-electric conversion element at a second depth from the first depth in the semiconductor substrate, the second photoelectric conversion element is at least partially overlapped by the first photo-electric conversion element in a vertical direction, and the second photoelectric conversion element is configured to convert a second visible light spectrum into a second photo charge.

The image sensor further includes a third pixel and a fourth pixel arranged in a second row. The third pixel includes a third photoelectric conversion element at a second depth and the third photoelectric conversion element is configured to convert the second visible light spectrum into a third photo charge, and the fourth pixel includes a fourth photoelectric conversion element at a third depth from the second depth in the semiconductor substrate, the fourth photoelectric conversion element is at least partially overlapped by the third photoelectric conversion element in a vertical direction, and the fourth photoelectric conversion element is configured to convert a third visible light spectrum into a fourth photo charge.

According to an example embodiment, the first pixel and the third pixel share a first floating diffusion node in the semiconductor substrate, and the second pixel and the fourth pixel share a second floating diffusion node in the semiconductor substrate.

According to another example embodiment, the first pixel, the second pixel, the third pixel, and the fourth pixel share a floating diffusion node in the semiconductor substrate.

An overlapped region of the first photoelectric conversion element and the second photoelectric conversion element is shorter than a length of the first photoelectric conversion element, and an overlapped region of the third photoelectric conversion element and the fourth photoelectric conversion element is shorter than a length of the third photoelectric conversion element.

The image sensor may be embodied in a backside illumination (BSI) image sensor. An image processing device according to an example embodiment of inventive concepts includes the image sensor and a processor configured to control the image sensor.

A portable electronic device according to an example embodiment of inventive concepts includes the image sensor and an application processor controlling the image sensor.

At least another example embodiment discloses and image sensor including a first pixel and a second pixel, the first pixel including a first photoelectric conversion element in a semiconductor substrate, and the second pixel including, a second photoelectric conversion element in the semiconductor substrate, at least a portion of the first photoelectric conversion element covers at least a portion of the second photoelectric conversion element in a vertical direction.

BRIEF DESCRIPTION OF THE DRAWINGS

These and/or other aspects and advantages of inventive concepts will become apparent and more readily appreciated from the following description of the embodiments, taken in conjunction with the accompanying drawings of which:

FIGS. 3A and 3B each represent a cross-sectional view taken along a line XI-XI' and a cross-sectional view taken along a line X2-X2' of FIG. 2;

DETAILED DESCRIPTION OF EXAMPLE EMBODIMENTS

Figure 1:
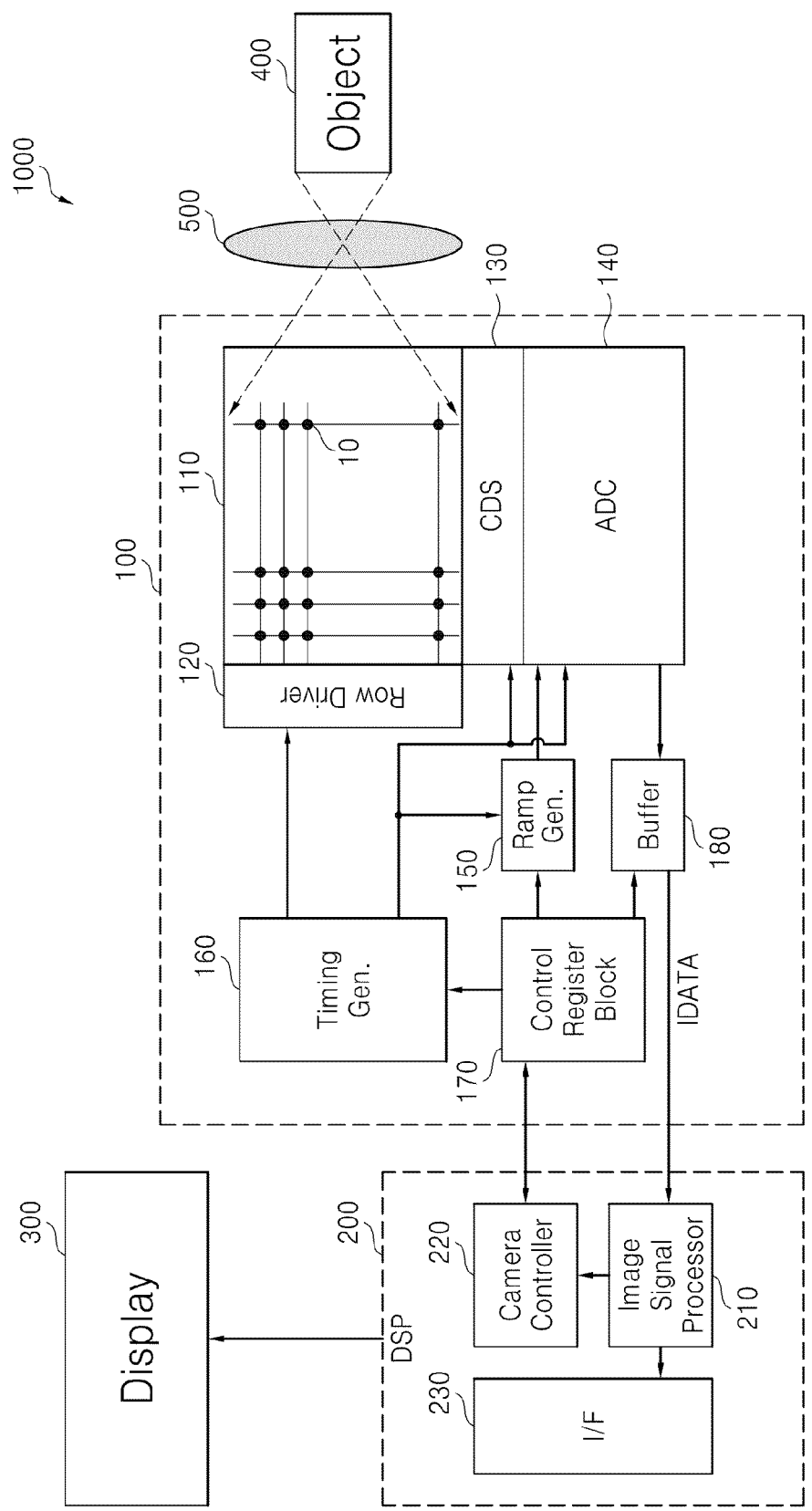
FIG. 1 is a schematic block view of an image processing device according to an example embodiment of inventive concepts.

Inventive concepts now will be described more fully hereinafter with reference to the accompanying drawings, in which example embodiments are shown. Inventive concepts may, however, be embodied in many different forms and should not be construed as limited to example embodiments set forth herein. Rather, example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc, may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block view of an image processing device according to an example embodiment of inventive concepts. Referring to FIG. 1, an image processing device 1000 may be embodied in a portable electronic device such as a digital camera, a mobile phone, a smart phone, a tablet personal computer (PC), a personal digital assistant (PDA), a mobile internet device (MID), or a wearable computer.

The image processing device 1000 includes a CMOS image sensor 100, a digital signal processor (DSP) 200, a display 300, and an optical lens 500. According to an example embodiment, the image processing device 1000 may not include the optical lens 500.

The CMOS image sensor 100 may generate image data IDATA for a subject incident through the optical lens 500. The CMOS image sensor 100 may be embodied in a backside illumination (BSI) image sensor.

The CMOS image sensor 100 may include an active pixel sensor array 110, a row driver 120, a correlated double sampling (CDS) block 130, an analog-to-digital converting (ADC) block 140, a ramp generator 150, a timing generator 160, a control register block 170, and a buffer 180.

The CMOS image sensor 100 may sense an image of the subject 400 captured or incident through the optical lens 500, and generate image data IDATA corresponding to a result of the sensing.

Figure 6:
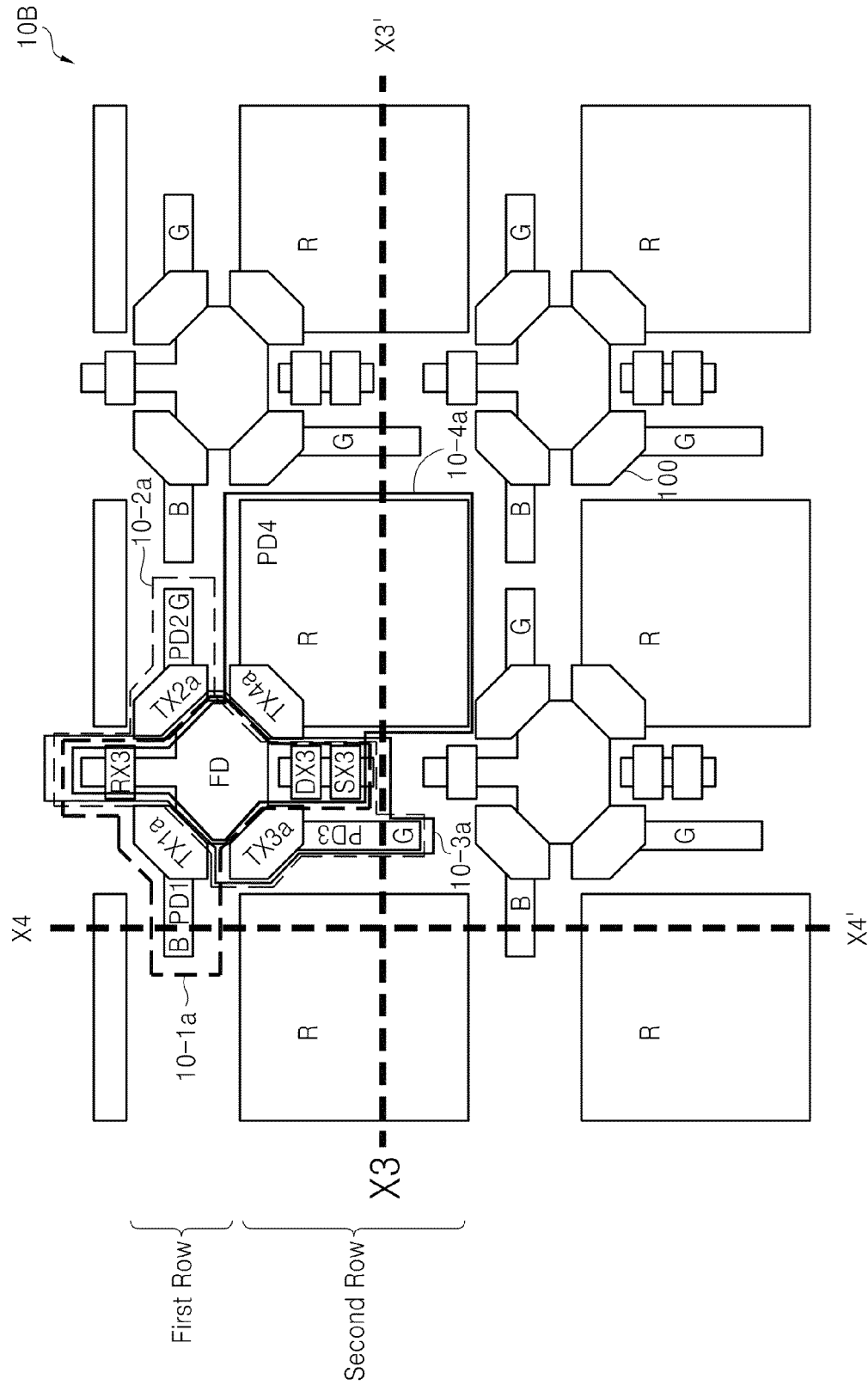
FIG. 6 represents another example embodiment of a plan view of a pixel group included in the pixel array of FIG. 1.

The active pixel sensor array 110 includes a plurality of pixel groups 10 arranged in a matrix shape. A pixel group 10A of FIG. 2 and a pixel group 10B of FIG. 6 are collectively referred to as the pixel group 10. Accordingly, the pixel group 10 includes a plurality of pixels.

The row driver 120 may generate control signals which may control an operation of each of a plurality of pixels included in the active pixel sensor array 110. The CDS block 130 may perform a correlated double sampling operation on a pixel signal output from each of the plurality of pixels using a ramp signal output from the ramp generator 150, and output a correlated double sampled pixel signal. The ADC block 140 may convert each of the correlated double sampled pixel signals into each digital signal by the CDS block 130.

The timing generator 160 may control the row driver 120, the CDS block 130, the ADC block 140, and/or the ramp generator 150 based on output signals of the control register block 170.

The control register block 170 may store control bits which may control an operation of the timing generator 160, the ramp generator 150, and/or the buffer 180. The buffer 180 may buffer digital signals output from the ADC block 140 and generate image data IDATA according to a result of the buffering. A DSP 200 may output image signals corresponding to the image data IDATA output from the CMOS image sensor 100 to a display 300.

The DSP 200 includes an image signal processor (ISP) 210, a camera controller 220, and an interface (I/F) 230.

The ISP 210 receives the image data IDATA output from the buffer 180, processes the received image data IDATA to be visible to people, and outputs the processed image data to the display 300 through the I/F 230.

The camera controller 220 controls an operation of the control register block 170. The camera controller 220 controls an operation of the CMOS image sensor 100, e.g., the control register block 170, using a protocol, e.g., an inter-integrated circuit (I2C); however, a technical concept of the present inventive concepts is not limited thereto.

In FIG. 1, it is illustrated that the ISP 210 is embodied in the DSP 200, however the ISP 210 may be embodied in the CMOS image sensor 100 according to an example embodiment. Moreover, the CMOS image sensor 100 and the ISP 210 may be embodied in one package, e.g., a multi-chip package (MCP) or a package on package (PoP).

Figure 2:
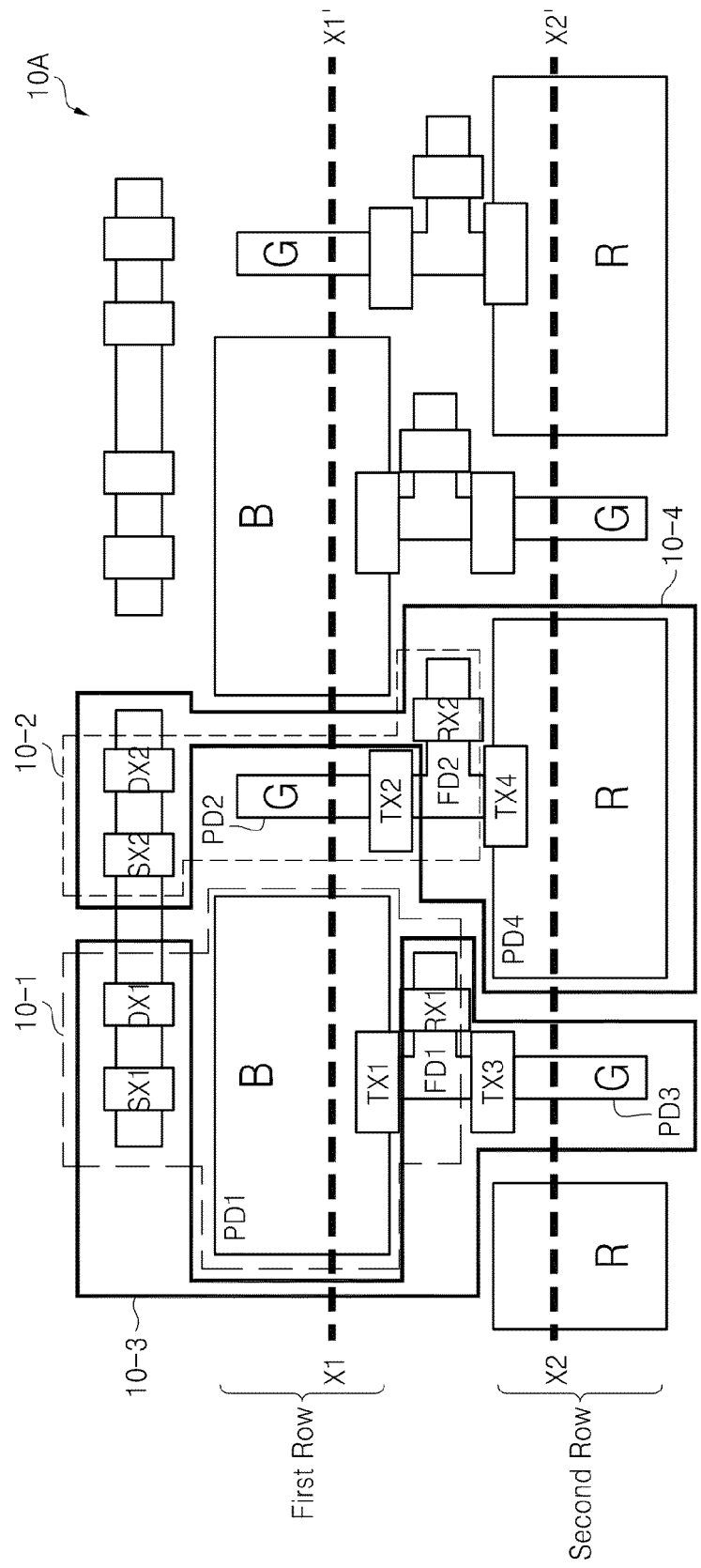
FIG. 2 represents an example embodiment of a plan view of a pixel group include in a pixel array of FIG. 1.

FIG. 2 represents an example embodiment of a plan view of a pixel group included in the pixel array in FIG. 1. Referring to FIG. 2, a pixel group 10A according to an example embodiment of the pixel group 10 of FIG. 1 may include a first pixel 10-1 and a second pixel 10-2 arranged in a first row, and a third pixel 10-3 and a fourth pixel 10-4 arranged in a second row.

That is, the first pixel 10-1 and the second pixel 10-2 may be repeatedly arranged in the first row, and the third pixel 10-3 and the fourth pixel 10-4 may be repeatedly arranged in the second row. Moreover, the first pixel 10-1 and the second pixel 10-2 may be repeatedly arranged in an odd numbered row, and the third pixel 10-3 and the fourth pixel 10-4 may be repeatedly arranged in an even numbered row. For convenience of description in FIG. 2, four pixels 10-1 to 10-4 are illustrated in detail.

The plan view of FIG. 2 projects and represents each component, e.g., each photoelectric conversion element B, G, and R, each transistor TX1, TX2, TX3, TX4, RX1, RX2, SX1, SX2, DX1, and DX2, each floating diffusion node FD1 and FD2, a plug, and/or a metal contact onto the same plane.

For example, when viewed from the photoelectric conversion element, B is a photoelectric conversion element PD1 which photoelectrically converts a blue spectrum into a first photo charge, G is a photoelectric conversion element PD2 and PD3 which photoelectrically converts a green spectrum into second and third photo charges, respectively, and R is a photoelectric conversion element PD4 which photoelectrically converts a red spectrum into a fourth photo charge. Here, a spectrum is a set of waves.

A structure and an operation of each component included in the plan view of FIG. 2 will be described in detail referring to FIGS. 2 to 5.

The first pixel 10-1 includes a first photoelectric conversion element PD1 which converts a first visible light spectrum, e.g., the blue spectrum, into the first photo charge(s), a first transmission transistor TX1, a first floating diffusion node FD1, a first reset transistor RX1, a first drive transistor DX1, and a first selection transistor SX1.

The second pixel 10-2 includes a second photoelectric conversion element PD2 which converts a second visible light spectrum, e.g., the green spectrum, into the second photo charge(s), a second transmission transistor TX2, a second floating diffusion node FD2, a second reset transistor RX2, a second drive transistor DX2, and a second selection transistor SX2.

The third pixel 10-3 includes a third photoelectric conversion element PD3 which converts the second visible light spectrum, e.g., the green spectrum, into the third photo charge(s), a third transmission transistor TX3, the first floating diffusion node FD1, the first reset transistor RX1, the first drive transistor DX1, and the first selection transistor SX1.

The fourth pixel 10-4 includes a fourth photoelectric conversion element PD4 which converts a third visible light spectrum, e.g., the red spectrum, into the fourth photo charge(s), a fourth transmission transistor TX4, the second floating diffusion node FD2, the second reset transistor RX2, the second drive transistor DX2, and the second selection transistor SX2.

Figure 4:
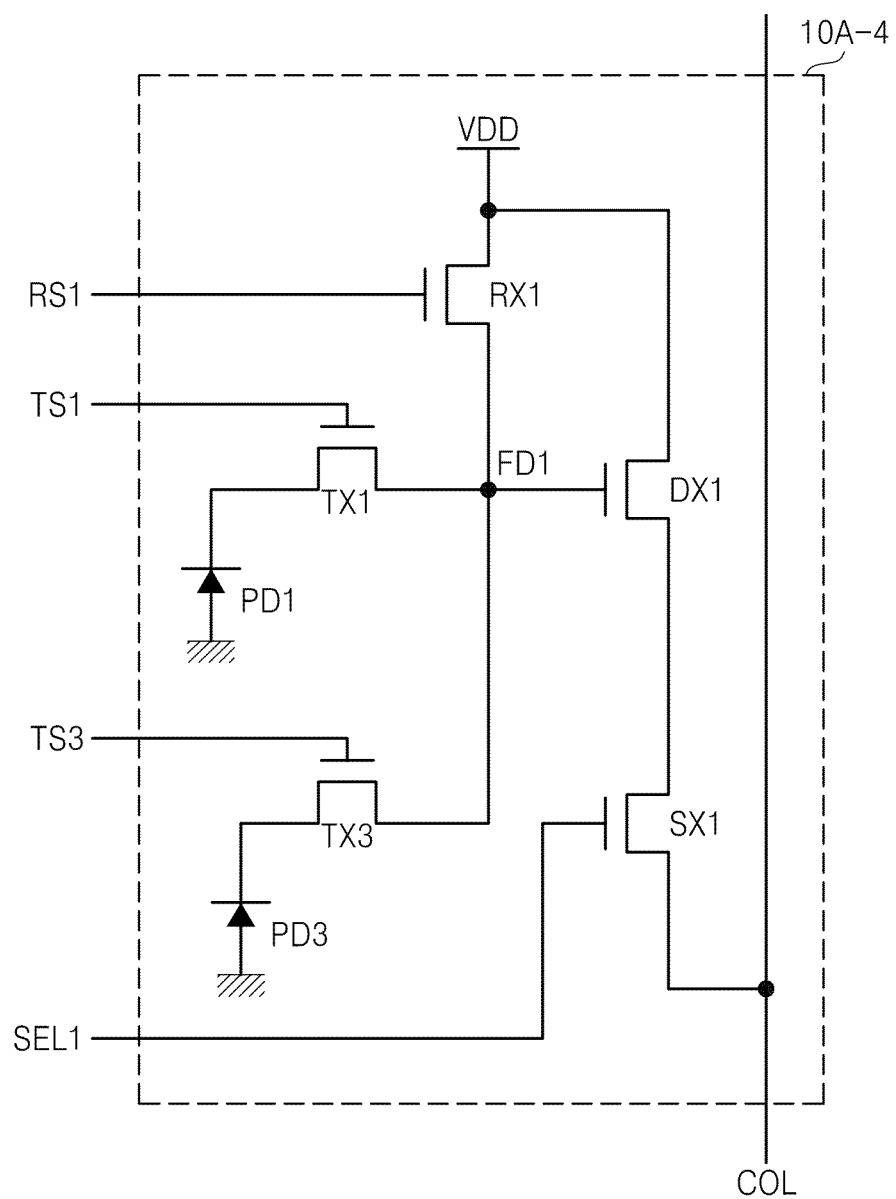
FIG. 4 represents a circuit view including a first pixel and a third pixel which are illustrated in FIG. 2 and share a first floating diffusion node.

The first pixel 10-1 and the third pixel 10-3 share the first floating diffusion node FD1, the first reset transistor RX1, the first drive transistor DX1, and the first selection transistor SX1 as illustrated in FIG. 4.

Figure 5:
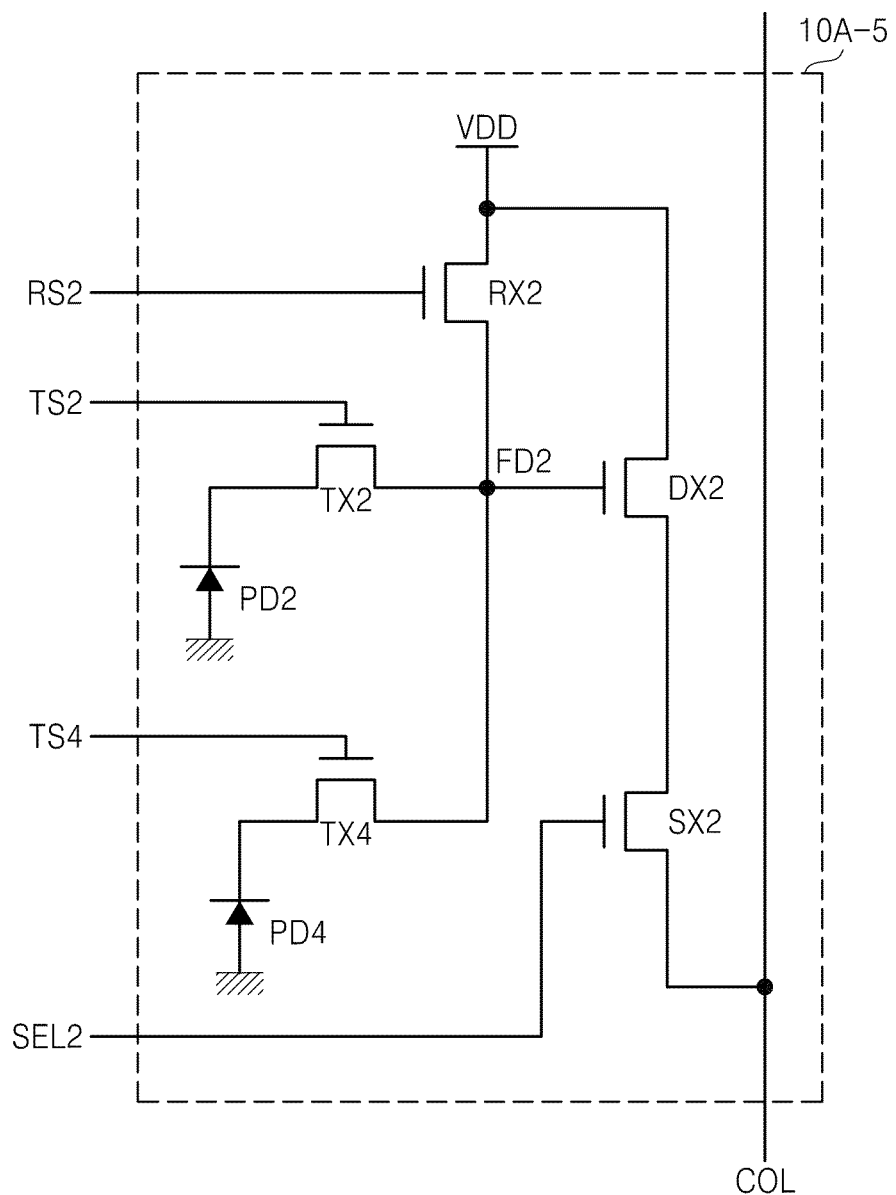
FIG. 5 represents a circuit view including a second pixel and a fourth pixel which are illustrated in FIG. 2 and share a second floating diffusion node.

The second pixel 10-2 and the fourth pixel 10-4 share the second floating diffusion node FD2, the second reset transistor RX2, the second drive transistor DX2, and the second selection transistor SX2 as illustrated in FIG. 5.

FIGS. 3A and 3B each represent a cross-sectional view taken along a line XI-XI' and a cross-sectional view taken along a line X2-X2' of FIG. 2. A XI-XI' cross-sectional view illustrated in FIG. 3A includes the first photoelectric conversion element PD1, the second photoelectric conversion element PD2, a readout circuit region 20, a semiconductor substrate 30, and a plurality of charge transmission paths PL1, PL2, and PL3. In some cases, a charge transmission path performing a function of transmitting a charge may be referred to as a channel or a plug.

For example, in the read out circuit region 20, processing circuits which may process charges output from a corresponding photoelectric conversion element, e.g., a corresponding floating diffusion node and one or more transistors, may be embodied.

The first photoelectric conversion element PD1 may be formed at a first depth H1 in the semiconductor substrate 30, and the second photoelectric conversion element PD2 may be formed at a second depth H2 from the first depth in the semiconductor substrate 30. Here, the first depth H1 is on the basis of a bottom surface of the semiconductor substrate 30.

The second photoelectric conversion element PD2, over the first photoelectric conversion element PD1, may partially overlap the first photoelectric conversion element PD1 in a vertical direction. In other words, a portion of the second photoelectric conversion element PD2 covers a portion of the first photoelectric conversion element PD1 and vice versa.

When the first photoelectric conversion element PD1 and the second photoelectric conversion element PD2 partially overlap each other, an overlapped region L2 of the first photoelectric conversion element PD1 and the second photoelectric conversion element PD2 may be embodied shorter than the length of the first photoelectric conversion element PD1. For example, there may be L2<(0.5*L1).

The X2-X2' cross-sectional view 10A-2 illustrated in FIG. 3B includes the first photoelectric conversion element, a third photoelectric conversion element PD3, a fourth photoelectric conversion element PD4, a readout circuit region 20a, the semiconductor substrate 30, and a plurality of charge transmission paths PL4 and PL5.

The third photoelectric conversion element PD3 may be formed at the second depth H2 in the semiconductor substrate 30, and the fourth photoelectric conversion element PD4 may be formed at a third depth H3 from the second depth H2 in the semiconductor substrate 30. The fourth photoelectric conversion element PD4, over the third photoelectric conversion element PD3, may partially overlap the third photoelectric conversion element. PD3 in a vertical direction. In other words, a portion of the fourth photoelectric conversion element PD4 covers a portion of the third photoelectric conversion element PD3 and vice versa.

When the third photoelectric conversion element PD3 and the fourth photoelectric conversion element PD4 overlap each other, each overlapped region L4 and L5 of the third photoelectric conversion element PD3 and the fourth photoelectric conversion element PD4 may be embodied shorter than the length L3 of the third photoelectric conversion element PD3. For example, there may be L4<(0.5*L3) or L5<(0.5*L3).

For example, in the readout circuit region 20a, processing circuits which may process charges output from a corresponding photoelectric conversion element, e.g., a corresponding floating diffusion node and one or more transistors, may be embodied.

When the semiconductor substrate 30 is doped with one of an n-type impurity and a p-type impurity, each photoelectric conversion element PD1 to PD4 may be doped with the other of the n-type impurity and the p-type impurity.

FIG. 4 represents a circuit view including a first pixel and a third pixel which are illustrated in FIG. 2 and share a first floating diffusion node. Referring to FIGS. 2, 3, and 4, a two-shared pixel 10A-4 includes the first pixel 10-1 and the third pixel 10-3.

Each pixel 10-1 and 10-3 shares the first floating diffusion node PD1, the first reset transistor RX1, the first drive transistor DX1, and the first selection transistor SX1.

The first reset transistor RX1 resets the first floating diffusion node FD1 in response to a reset signal RS1 output from the row driver 120. The first transmission transistor TX1 transmits charges accumulated in the first photoelectric conversion element PD1 to the first floating diffusion node MI in response to a first transmission control signal TS1 output from the row driver 120.

The third transmission transistor TX3 transmits charges accumulated in the third photoelectric conversion element PD3 to the first floating diffusion node FD1 in response to a third transmission control signal TS3 output from the row driver 120.

A generation timing of each transmission control signal TS1 and TS3 may be variously designed according to a design specification of the image processing device 1000.

The first drive transistor DX1 may perform a source following operation based on a voltage corresponding to the charges accumulated in the first floating diffusion node FD1 and a supply voltage VDD. The first selection transistor SX1 may transmit a signal, e.g., a pixel signal, output from the first drive transistor DX1 to a column line COL in response to a first selection signal SEL1.

FIG. 5 represents a circuit view including a second pixel and a fourth pixel which are illustrated in FIG. 2 and share a second floating diffusion node.

Referring to FIGS. 2, 3, and 5, a two-shared pixel 10A-5 includes the second pixel 10-2 and the fourth pixel 10-4.

Each pixel 10-2 and 10-4 shares the second floating diffusion node FD2, the second reset transistor RX2, the second drive transistor DX2, and the second selection transistor SX2.

The second reset transistor RX2 resets the second floating diffusion node FD2 in response to a second reset signal RS2 output from the row driver 120. The second transmission transistor TX2 transmits the charges accumulated in the second photoelectric conversion element PD2 to the second floating diffusion node FD2 in response to a second transmission control signal TS2 output from the row driver 120.

The fourth transmission transistor TX4 transmits charges accumulated in the fourth photoelectric conversion element PD4 to the second floating diffusion node FD2 in response to a fourth transmission control signal TS4 output from the row driver 120. A generation timing of each transmission control signal TS2 and TS4 may be variously designed according to a design specification of the image processing device 1000.

The second drive transistor DX2 may perform the source following operation based on a voltage corresponding to the charges accumulated in the second floating diffusion node FD2 and the supply voltage VDD.

The second selection transistor SX2 may transmit a signal, e.g., a pixel signal, output from the second drive transistor DX2 to the column line COL in response to the second selection signal SEL2.

Each photoelectric conversion element PD1, PD2, PD3 and PD4 may be embodied in a photo diode, a photo transistor, a photo gate, a pinned photo diode (PPD), or a combination of these.

FIG. 6 represents another example embodiment of the plan view of a pixel group included in the pixel array of FIG. 1. Referring to FIG. 6, a pixel group 10B according to another example embodiment of the pixel group 10 of FIG. 1 may include a first pixel 10-1a and a second pixel 10-2a arranged in a first row, and a third pixel 10-3a and a fourth pixel 10-4a arranged in a second row. That is, the first pixel 10-1a and the second pixel 10-2a may be repeatedly arranged in the first row; and the third pixel 10-3a and the fourth pixel 10-4a may be repeatedly arranged in the second row.

Moreover, the first pixel 10-1a and the second pixel 10-2a may be repeatedly arranged in an odd numbered row, and the third pixel 10-3a and the fourth pixel 10-4a may be repeatedly arranged in an even numbered row.

For convenience of description in FIG. 6, four pixels 10-1a to 10-4a are described in detail. The plan view of FIG. 6 projects and represents each component, e.g., each photoelectric conversion element B, G, and R, each transistor TX1a, TX2a, TX3a, TX4a, RX3, DX3, and SX3, a floating diffusion node FD, a plug, and/or a metal contact onto the same plane.

As described above, when viewed from the photoelectric conversion element, B is a photoelectric conversion element PD1 which photoelectrically converts the blue spectrum, G is a photoelectric conversion element PD2 and PD3 which photoelectrically converts the green spectrum, and R is a photoelectric conversion element PD4 which photoelectrically converts the red spectrum.

A structure and an operation of each component included in the plan view of FIG. 6 will be described in detail referring to FIGS. 6 to 8.

The first pixel 10-1a includes the first photoelectric conversion element PD1 which converts the first visible light spectrum, e.g., the blue spectrum, into a first photo charge(s), a first transmission transistor TX1a, the floating diffusion node FD, a third reset transistor RX3, a third drive transistor DX3, and a third selection transistor SX3.

The second pixel 10-2.a includes the second photoelectric conversion element PD2 which converts the second visible light spectrum, e.g., the green spectrum, into a second photo charge(s), a second transmission transistor TX2a, the floating diffusion node FD, the third reset transistor RX3, the third drive transistor DX3, and the third selection transistor SX3.

The third pixel 10-3a includes the third photoelectric conversion element PD3 which converts the second visible light spectrum, e.g., the green spectrum, into a third photo charge(s), a third transmission transistor TX3a, the floating diffusion node FD, the third reset transistor RX3, the third drive transistor DX3, and the third selection transistor SX3.

The fourth pixel 10-4a includes the fourth photoelectric conversion element PD4, which converts the third visible light spectrum, e.g., the red spectrum, into a fourth photo charge(s), a fourth transmission transistor TX4a, the floating diffusion node FD, the third reset transistor RX3, the third drive transistor DX3, and the third selection transistor SX3.

The first pixel 10-1a, the second pixel 10-2a, the third pixel 10-3a, and the fourth pixel 10-4a share the floating diffusion node FD, the third reset transistor RX3, the third drive transistor DX3, and the third selection transistor SX3.

Figure 7A:
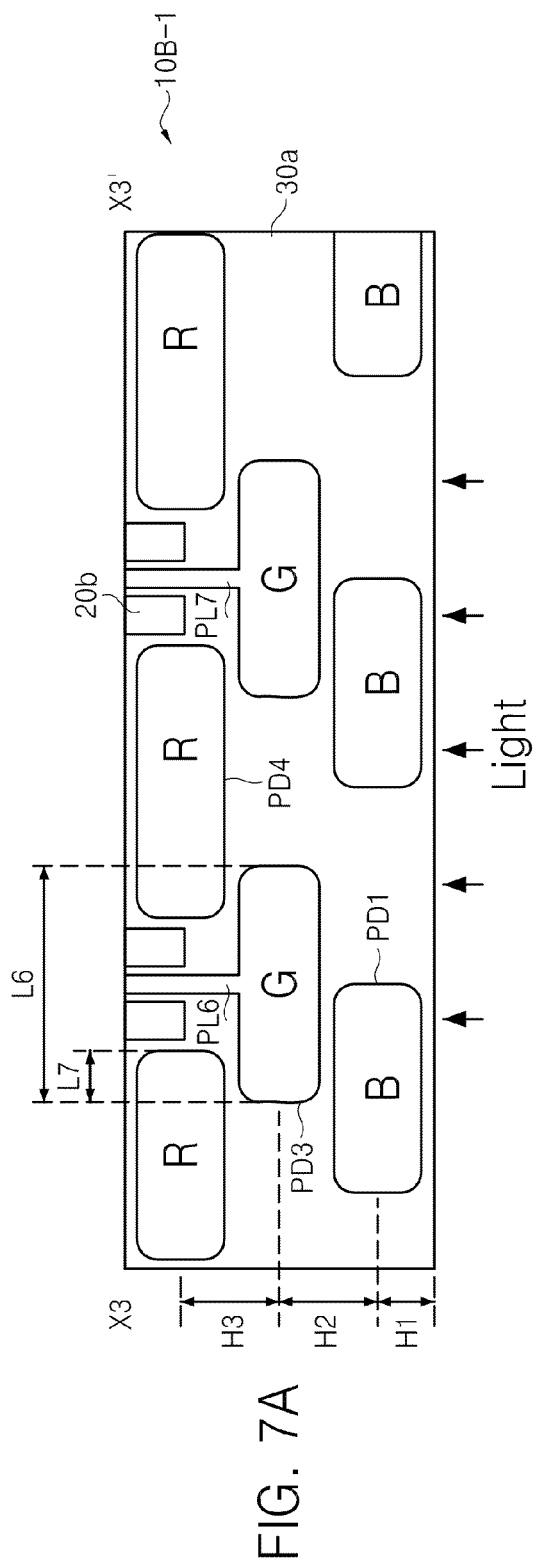
FIGS. 7A and 7B each represent a cross-sectional view taken along a line X4-X4' of FIG. 6 and a cross-sectional view taken along a line X4-X4' of FIG. 6.
Figure 7B:
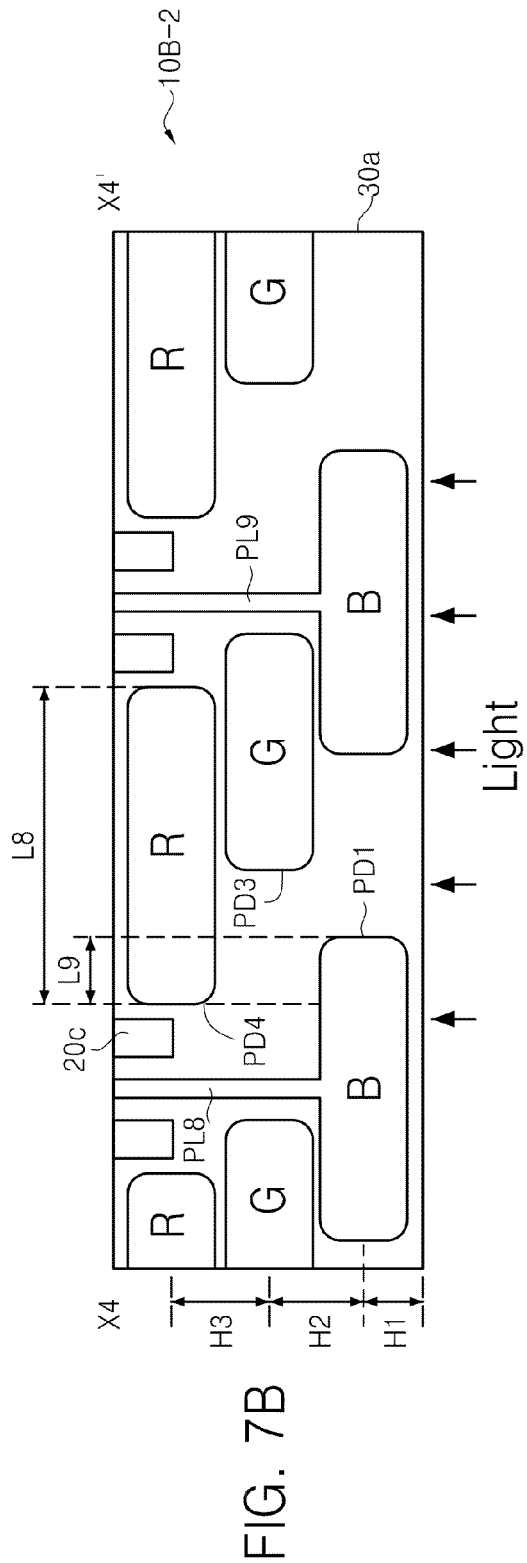

FIGS. 7A and 7B each represent a cross-sectional view taken along a line X4-X4' of FIG. 6 and a cross-sectional view taken along a line X4 X4' of FIG. 6. The X3-X3' cross-sectional view 10B-1 illustrated in FIG. 7A includes the first photoelectric conversion element PD1, the third photoelectric conversion element PD3, the fourth photoelectric conversion element PD4, a readout circuit region 20b, a semiconductor substrate 30a, and a plurality of charge transmission paths PL6 and PL7.

The first photoelectric conversion element PD1 may be formed at a first depth H1 in the semiconductor substrate 30a, the third photoelectric conversion element PD3 may be formed at a second depth H2 from the first depth H1 in the semiconductor substrate 30a, and the fourth photoelectric conversion element PD4 may be formed at the third depth H3 from the second depth H2 in the semiconductor substrate 30a. Here, the first depth H1 is on the basis of the bottom surface of semiconductor substrate 30a.

The third photoelectric conversion element PD3, over the first photoelectric conversion element PD1, may partially overlap the first photoelectric conversion element PD1 in a vertical direction. In other words, a portion of the third photoelectric conversion element PD1 covers a portion of the first photoelectric conversion element PD1 and vice versa.

When the first photoelectric conversion element PD1 and the third photoelectric conversion element PD3 partially overlap each other, an overlapped region of the first photoelectric conversion element PD1 and the third photoelectric conversion element PD3 may be embodied shorter than the length of the first photoelectric conversion element PD1. The overlapped region may be embodied shorter than a half of the length.

The fourth photoelectric conversion element PD4 embodied over the third photoelectric conversion element PD3 may partially overlap the third photoelectric conversion element PD3 in a vertical direction. In other words, a portion of the fourth photoelectric conversion element PD4 covers a portion of the third photoelectric conversion element PD3 and vice versa. An overlapped region L7 of the third photoelectric conversion element PD3 and the fourth photoelectric conversion element PD4 may be embodied shorter than the length L6 of the third photoelectric conversion element PD3. For example, there may be L7<(0.5*L6).

For example, in the readout circuit region 20b, processing circuits which may process charges output from a corresponding photoelectric conversion element, e.g., a corresponding floating diffusion node and one or more transistors, may be embodied.

The X4-X4' cross-sectional view 10B-2 illustrated in FIG. 7B includes the first photoelectric conversion element PD1 the third photoelectric conversion element PD3, the fourth photoelectric conversion element PD4, a readout circuit region 20c, the semiconductor substrate 30a, and a plurality of charge transmission paths PL8 and PL9.

The first photoelectric conversion element PD1 may be formed at the first depth H1 in the semiconductor substrate 30a, the third photoelectric conversion element PD3 may be formed at the second depth H2 from the first depth H1 in the semiconductor substrate 30a, and the fourth photoelectric conversion element. PD4 may be formed at the third depth 113 from the second depth H2 in the semiconductor substrate 30a.

For example, in the readout circuit region 20c, processing circuits which may process charges output from a corresponding photoelectric conversion element, e.g., a corresponding floating diffusion node and one or more transistors, may be embodied.

Figure 8:
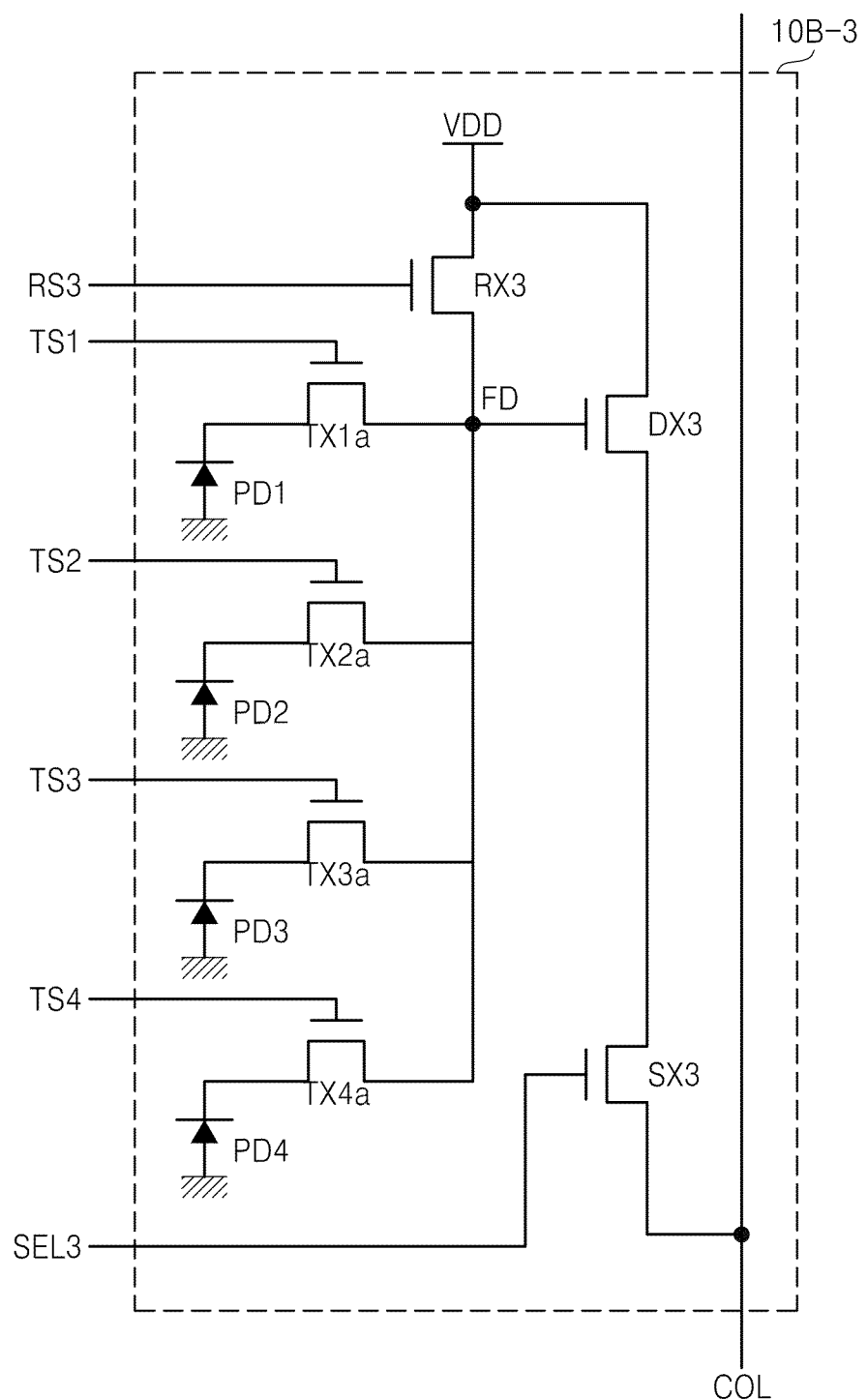
FIG. 8 represents a circuit view including four pixels which are illustrated in FIG. 6 and share one floating diffusion node.

FIG. 8 represents a circuit view including four pixels which are illustrated in FIG. 6 and share one floating diffusion node. Referring to FIGS. 6 to 8, a four-shared pixel 10B-3 includes the first pixel 10-1a, the second pixel 10-2a, the third pixel 10-3a, and the fourth pixel 10-4a.

Each pixel 10-1a to 10-4a shares the floating diffusion node FD, the third reset transistor RX3, the third drive transistor DX3, and the third selection transistor SX3.

The third reset transistor RX3 resets the floating diffusion node FD in response to the third reset signal RS3 output from the row driver 120.

The first transmission transistor TX1a transmits the charges accumulated in the first photoelectric conversion element PD1 to the floating diffusion node FD in response to a first transmission control signal TS1 output from the row driver 120. The second transmission transistor TX2a transmits the charges accumulated in the second photoelectric conversion element PD2 to the floating diffusion node FD in response to a second transmission control signal TS2 output from the row driver 120.

The third transmission transistor TX3a transmits the charges accumulated in the third photoelectric conversion element PD3 to the floating diffusion node FD in response to a third transmission control signal TS3 output from the row driver 120. The fourth transmission transistor TX4a transmits the charges accumulated in the fourth photoelectric conversion element PD4 to the floating diffusion node FD in response to a fourth transmission control signal TS4 output from the row driver 120.

A generation timing of each transmission control signal TS1, TS2, TS3, and TS4 may be variously designed according to a design specification of the image processing device 1000.

The third drive transistor DX3 may perform the source following operation based on a voltage corresponding to the charges accumulated in the floating diffusion node FD and the supply voltage VDD. The third selection transistor SX3 may transmit a signal, e.g., a pixel signal, output from the third drive transistor DX3 to the column line COL in response to the third selection signal SEL3.

Figure 9:
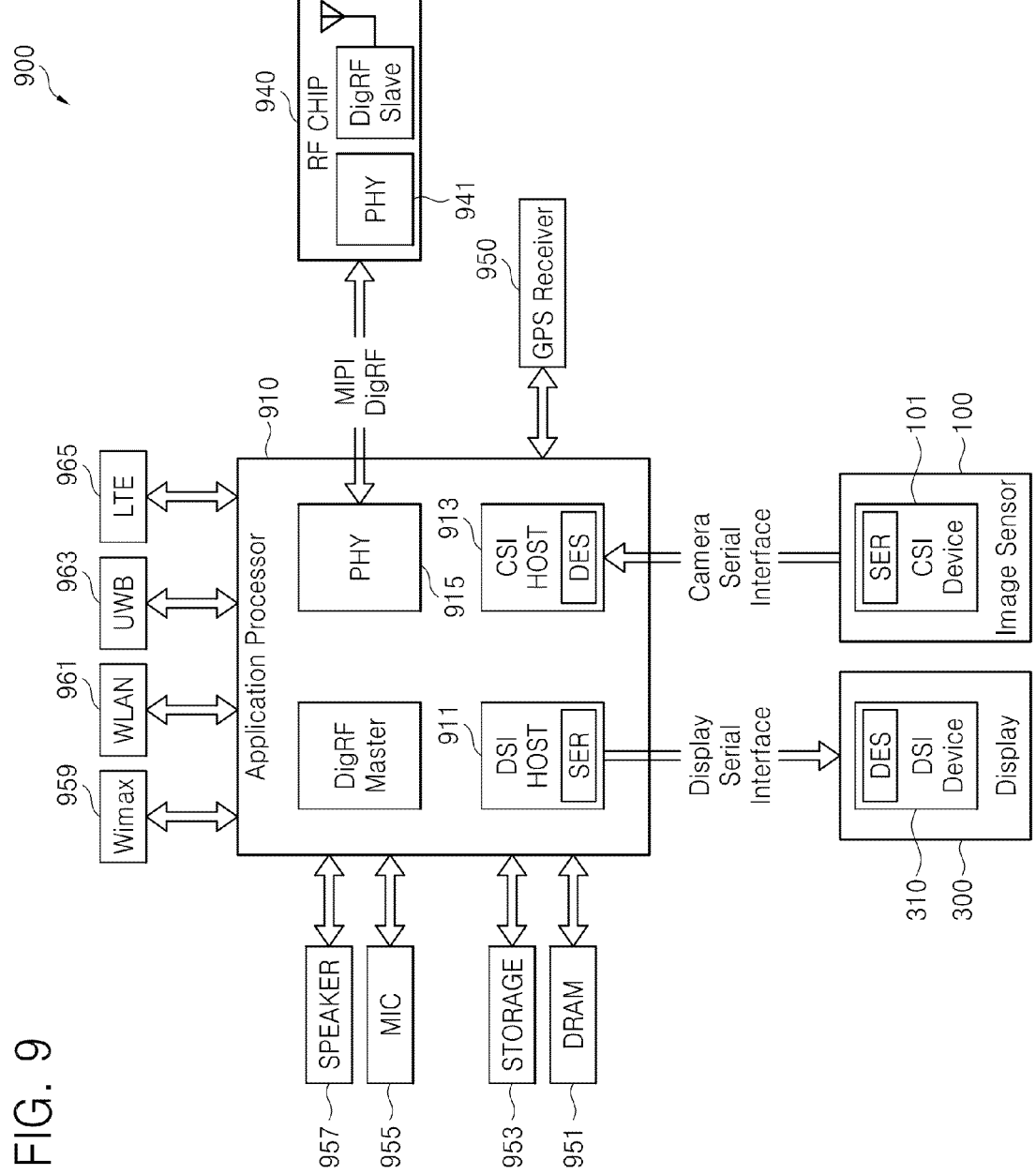
FIG. 9 is a schematic block view of an image processing device according to another example embodiment of inventive concepts.

FIG. 9 is a schematic block view of an image processing device according to another example embodiment of inventive concepts. Referring to FIGS. 1 to 9, an image processing device 900 may be embodied in a portable electronic device which may use or support a mobile industry processor interface (MIPI®) standard or an Embedded DisplayPort (eDP) standard.

The portable electronic device may be embodied in a laptop computer, a personal digital assistant (PDA), a portable media player (PMP), a mobile phone, a smart phone, a tablet personal computer (PC), a digital camera, a mobile internet device (MID), or a wearable computer.

The image processing device 900 includes an application processor (AP) 910, a CMOS image sensor 100, and a display 300. A camera serial interface (CSI) host 913 embodied in the AP 910 may perform a serial communication with a CSI device 101 of a CMOS image sensor 100 through a camera serial interface CSI.

According to an example embodiment, a de-serializer DES may be embodied in the CSI host 913, and a serializer SER may be embodied in the CSI device 101.

The CMOS image sensor 100 may be the CMOS image sensor 100 described referring to FIGS. 1 to 8. A display serial interface (DSI) host 911 embodied in the AP 910 may perform the serial communication with a DSI device 310 of the display 300 through a display serial interface.

According to an example embodiment, a serializer SER may be embodied in the DSI host 911, and a de-serializer DES may be embodied in the DSI device 310. Each of the deserializer DES and the serializer SER may process an electrical signal or an optical signal.

The image processing device 900 may further include a radio frequency (RF) chip 940 which may communicate with the AP 910. A physical layer 915 of the AP 910 and a PHY 941 of the RF chip 940 may transmit or receive data according to MIPI DigRF.

The image processing device 900 may further include a GPS receiver 950, a memory 951 such as a dynamic random access memory (DRAM), a data storage device 953 embodied in a non-volatile memory such as a NAND flash memory, a microphone 955, and a speaker 957.

The image processing device 900 may communicate with an external device using at least one communication protocol or communication standard, e.g., worldwide interoperability for microwave access (WiMAX) 959, Wireless LAN (WLAN) 961, ultra-wideband (UWB) 963, or long term evolution (LTE™) 965. The image processing device 900 may communicate with an external device using Bluetooth or WiFi.

An image sensor according to an example embodiment of inventive concepts may increase a size of a photoelectric conversion element formed in a semiconductor device to improve the sensitivity of a pixel including the photoelectric conversion element and to increase full-well capacity. The image sensor according to an example embodiment of inventive concepts does not include a color filter, thereby preventing light loss caused by the color filter.

Although example embodiments of inventive concepts have been shown and described, it will be appreciated by those skilled in the art that changes may be made in example embodiments without departing from the principles and spirit of inventive concepts, the scope of which is defined in the appended claims and their equivalents.

What is claimed is:

1. An image sensor comprising:
   a first pixel and a second pixel in a first row, wherein
   the first pixel includes a first photoelectric conversion element at a first depth in a semiconductor substrate and the first photoelectric conversion element is configured to convert a first visible light spectrum into a first photo charge, and
   the second pixel includes a second photoelectric conversion element at a second depth from the first depth in the semiconductor substrate, a portion of the second photoelectric conversion element is overlapped by a portion of the first photoelectric conversion element in a vertical direction, and the second photoelectric conversion element is configured to convert a second visible light spectrum into a second photo charge, the portion of the second photoelectric conversion element being less than the entire second photoelectric conversion element and the portion of the first photoelectric conversion element being less than the entire first photoelectric conversion element.

2. The image sensor of claim 1, further comprising:
   a third pixel and a fourth pixel in a second row,
   wherein the third pixel includes a third photoelectric conversion element at the second depth and the third photoelectric conversion element is configured to convert the second visible light spectrum into a third photo charge, and
   the fourth pixel includes a fourth photoelectric conversion element at a third depth from the second depth in the semiconductor substrate, the fourth photoelectric conversion element is at least partially overlapped by the third photoelectric conversion element in a vertical direction, and the fourth photoelectric conversion element is configured to convert a third visible light spectrum into a fourth photo charge.

3. The image sensor of claim 2, wherein the first pixel and the third pixel share a first floating diffusion node in the semiconductor substrate, and the second pixel and the fourth pixel share a second floating diffusion node in the semiconductor substrate.

4. The image sensor of claim 2, wherein the first pixel, the second pixel, the third pixel, and the fourth pixel share a floating diffusion node in the semiconductor substrate.

5. An image sensor comprising:
   a first pixel and a second pixel in a first row, wherein
   the first pixel includes a first photoelectric conversion element at a first depth in a semiconductor substrate and the first photoelectric conversion element is configured to convert a first visible light spectrum into a first photo charge, and
   the second pixel includes a second photoelectric conversion element at a second depth from the first depth in the semiconductor substrate, the second photoelectric conversion element is at least partially overlapped by the first photoelectric conversion element in a vertical direction, and the second photoelectric conversion element is configured to convert a second visible light spectrum into a second photo charge, wherein
   the semiconductor substrate is doped with one of a first impurity and a second impurity; and
   the first pixel and the second pixel are doped with another of the first impurity and the second impurity.

6. The image sensor of claim 2, wherein the image sensor is a backside illumination (BSI) image sensor.

7. An image processing device comprising:
   the image sensor of claim 1; and
   a processor configured to control the image sensor.

8. The image processing device of claim 7, wherein the image sensor further includes a third pixel and a fourth pixel in a second row,
   wherein the third pixel includes a third photoelectric conversion element at the second depth and the third photoelectric conversion element is configured to convert the second visible light spectrum into a third photo charge, and
   the fourth pixel includes a fourth photoelectric conversion element at a third depth from the second depth in the semiconductor substrate, the fourth photoelectric conversion element is at least partially overlapped by the third photoelectric conversion element in a vertical direction, and the fourth photoelectric conversion element is configured to convert a third visible light spectrum into a fourth photo charge.

9. The image processing device of claim 8, wherein the first pixel and the third pixel share a first floating diffusion node in the semiconductor substrate, and the second pixel and the fourth pixel share a second floating diffusion node in the semiconductor substrate.

10. The image processing device of claim 8, wherein the first pixel, the second pixel, the third pixel, and the fourth pixel share a floating diffusion node in the semiconductor substrate.

11. A portable electronic device comprising:
    the image sensor of claim 1; and
    an application processor configured to control the image sensor.

12. The portable electronic device of claim 11, wherein the image sensor further includes a third pixel and a fourth pixel in a second row, and the third pixel includes a third photoelectric conversion element at the second depth and the third photoelectric conversion element is configured to convert the second visible light spectrum into a third photo charge, and
    the fourth pixel includes a fourth photoelectric conversion element at a third depth from the second depth in the semiconductor substrate, the fourth photoelectric conversion element is at least partially overlapped by the third photoelectric conversion element in a vertical direction, and the fourth photoelectric conversion element is configured to convert a third visible light spectrum into a fourth photo charge.

13. The portable electronic device of claim 12, wherein the first pixel and the third pixel share a first floating diffusion node in the semiconductor substrate, and the second pixel and the fourth pixel share a second floating diffusion node in the semiconductor substrate.

14. The portable electronic device of claim 12, wherein the first pixel, the second pixel, the third pixel, and the fourth pixel share a floating diffusion node in the semiconductor substrate.

15. An image sensor comprising:
a first pixel and a second pixel,
the first pixel including,
a first photoelectric conversion element in a semiconductor substrate, and
the second pixel including,
a second photoelectric conversion element in the semiconductor substrate, at least a portion of the first photoelectric conversion element covering at least a portion of the second photoelectric conversion element in a vertical direction, the portion of the second photoelectric conversion element being less than the entire second photoelectric conversion element and the portion of the first photoelectric conversion element being less than the entire first photoelectric conversion element.

16. The image sensor of claim 15, further comprising:
a third pixel including a third photoelectric conversion element in the semiconductor substrate, at least a portion of the third photoelectric conversion element covering the portion of the first photoelectric conversion element and the portion of the second photoelectric conversion element.

17. The image sensor of claim 16, wherein the first photoelectric conversion element, the second photoelectric conversion element and the third photoelectric conversion element are at different depths in the semiconductor substrate.

18. The image sensor of claim 15, wherein the first pixel and the second pixel are in a same row.

19. The image sensor of claim 15, wherein
the semiconductor substrate is doped with one of a first impurity and a second impurity, and
the first pixel and the second pixel are doped with another of the first impurity and the second impurity.

* * * * *